United States Patent
Liu et al.

(10) Patent No.: US 9,991,322 B2
(45) Date of Patent: Jun. 5, 2018

(54) ORGANIC LIGHT EMITTING DISPLAY PANEL AND MANUFACTURING METHOD THEREOF, DISPLAY DEVICE

(71) Applicant: Boe Technology Group Co., Ltd., Beijing (CN)

(72) Inventors: Libin Liu, Beijing (CN); Xiaowei Xu, Beijing (CN); Liangjian Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/122,887

(22) PCT Filed: Sep. 29, 2015

(86) PCT No.: PCT/CN2015/091053
§ 371 (c)(1),
(2) Date: Aug. 31, 2016

(87) PCT Pub. No.: WO2016/176956
PCT Pub. Date: Nov. 10, 2016

(65) Prior Publication Data
US 2017/0077194 A1    Mar. 16, 2017

(30) Foreign Application Priority Data
May 6, 2015 (CN) .......................... 2015 1 0227515

(51) Int. Cl.
*H01L 27/32* (2006.01)
*H01L 51/56* (2006.01)

(52) U.S. Cl.
CPC .......... *H01L 27/3246* (2013.01); *H01L 27/32* (2013.01); *H01L 27/3276* (2013.01); *H01L 51/56* (2013.01); *H01L 2227/323* (2013.01)

(58) Field of Classification Search
CPC . H01L 27/32; H01L 27/3246; H01L 27/3276; H01L 51/56; H01L 2227/323
See application file for complete search history.

(56) References Cited

U.S. PATENT DOCUMENTS 9,337,244 B2 *  5/2016  Hatano ............... H01L 27/3246
9,679,952 B2 *  6/2017  Miyazawa .......... H01L 27/3246
(Continued)

FOREIGN PATENT DOCUMENTS

CN    1770243 A    5/2006
CN    1773721      5/2006
(Continued)

OTHER PUBLICATIONS

Office Action from Chinese Application No. 201510227515.X dated Aug. 4, 2016.
(Continued)

*Primary Examiner* — Allan R Wilson
(74) *Attorney, Agent, or Firm* — Calfee, Halter & Griswold LLP

(57) ABSTRACT

The present invention discloses an organic light emitting display panel and manufacturing method thereof and a display device, which can reduce the critical dimension bias of the pixel defining layer and improve the display uniformity. The organic light emitting display panel provide by the present invention comprises: a pixel defining layer, which is provided with a plurality of light emitting material filling areas, being characterized by further comprising: a metal layer provided on the pixel defining layer; the metal layer is provided with openings corresponding to the light emitting material filling areas respectively. The solutions provided by the present invention are used to improve the display effect of the organic light emitting display device.

9 Claims, 3 Drawing Sheets

(56) References Cited

U.S. PATENT DOCUMENTS

| | | | | |
|---|---|---|---|---|
| 2001/0035714 A1* | 11/2001 | Lu | ................... | H01L 27/3283 |
| | | | | 313/504 |
| 2004/0113550 A1* | 6/2004 | Adachi | ............... | H01L 27/3246 |
| | | | | 313/512 |
| 2013/0200422 A1* | 8/2013 | Chung | ................ | H01L 51/5253 |
| | | | | 257/99 |
| 2016/0043161 A1* | 2/2016 | Miyazawa | .......... | H01L 27/3246 |
| | | | | 257/40 |

FOREIGN PATENT DOCUMENTS

| | | | |
|---|---|---|---|
| CN | 1888978 | A | 1/2007 |
| CN | 101079429 | | 11/2007 |
| CN | 103268921 | | 8/2013 |
| CN | 103268921 | A | 8/2013 |
| JP | 2005142277 | A | 6/2005 |
| JP | 2009070708 | | 4/2009 |
| JP | 2009070708 | A | 4/2009 |

OTHER PUBLICATIONS

International Search Report from PCT Application No. PCT/CN2015/091053 dated Feb. 1, 2016.

Decision of Rejection for China Application No. 201510227515.X dated May 27, 2017.

Office Action from China Application No. 201510227515 dated Oct. 26, 2016.

Office Action from China Application No. 201510227515.X dated Feb. 15, 2017.

\* cited by examiner

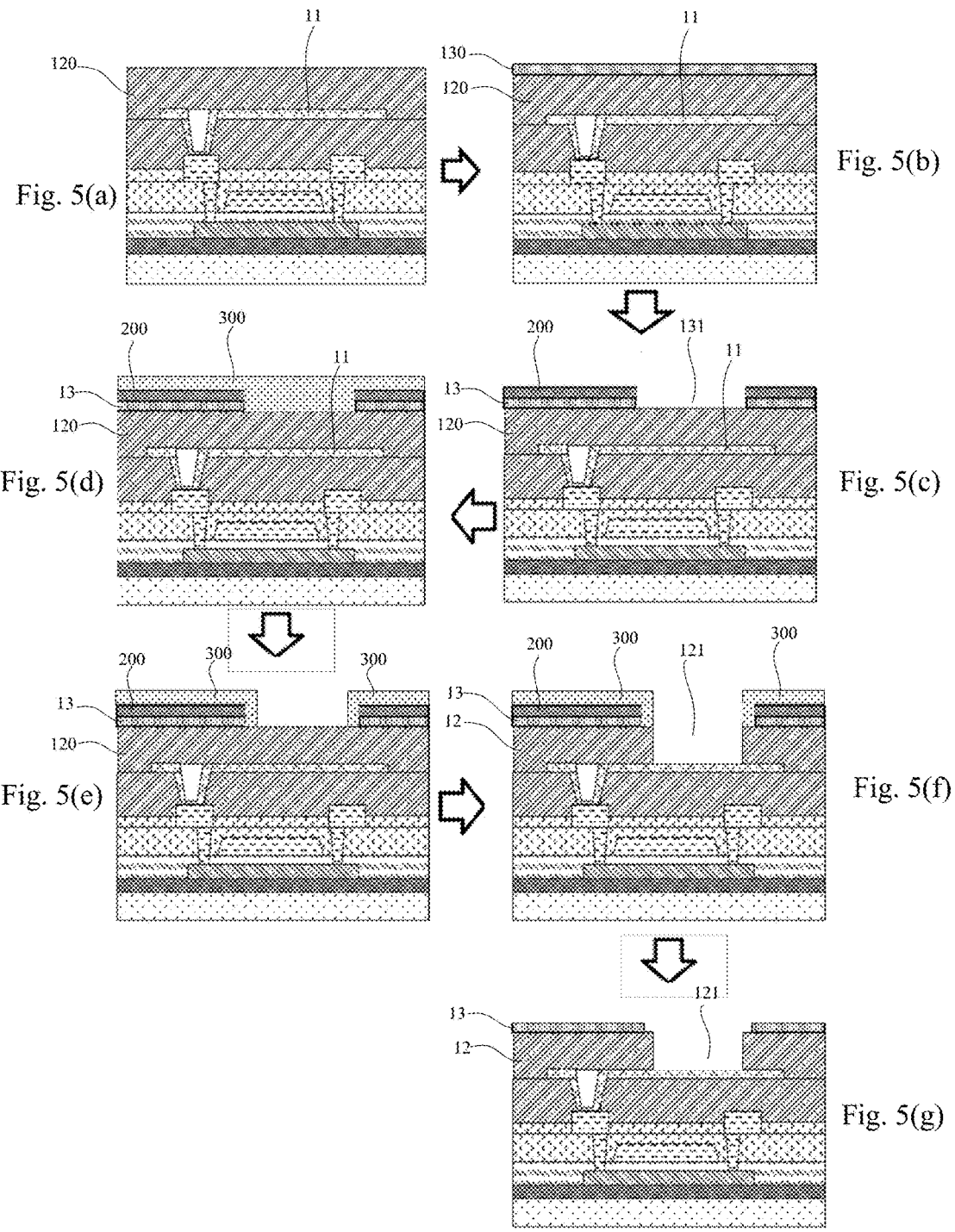

ORGANIC LIGHT EMITTING DISPLAY PANEL AND MANUFACTURING METHOD THEREOF, DISPLAY DEVICE

RELATED APPLICATIONS

The present application is the U.S. national phase entry of PCT/CN2015/091053, with an international filing date of Sep. 29, 2015, which claims the benefit of Chinese Patent Application No. 201510227515.X, filed on May 6, 2015, the entire disclosures of which are incorporated herein by reference.

TECHNICAL FIELD

The present invention relates to the display field, and in particular to an organic light emitting display panel and manufacturing method thereof, and a display device provided with the organic light emitting display panel.

BACKGROUND

Organic light emitting display (OLED) has been deemed as a newly emerging technology of the next generation of flat-panel displays because of such excellent characteristics as self-emission, no need of backlight source, high contrast, small thickness, wide viewing angle, fast response time, possibility of using in a flexible substrate, wide operating temperature range, simple structure and manufacturing processes etc.

An OLED display panel comprises a substrate, a (Indium Tin Oxide) (ITO) anode, a light emitting layer and a cathode etc., and its light emitting principle is that electrons and holes are recombined within the light emitting layer to fall into a lower energy band under the effect of a voltage, and emit photons which have the same energy as the energy gap, and its wavelength (emission color) depends on the magnitude of the energy gap of the light emitting layer. Therein, the light emitting layer is generally manufactured by an inkjet printing technology in which a pixel defining layer (PDL) is required to be made on the substrate in advance to define the pixel areas into which ink droplets are accurately sprayed. However, because the PDL is generally formed with an organic material film by using a photolithography process, a large exposure amount is required for the purpose of no photoresist residues, thereby resulting in a large Critical Dimension bias (around 2.0 μm). Moreover, it is further required that the organic material film is cured after form formation and the curing process may cause the organic material to contract such that the critical dimension bias further increases.

The above-mentioned Critical Dimension (referred to herein as "CD") is a specialized line pattern which is especially designed to indicate the width of feature lines of an integrated circuit for the purpose of evaluating and controlling the pattern processing precision of the integrated circuit photomask manufacturing and photolithography process. The critical dimension bias is the "After etch inspection CD" minus "the After develop inspection CD", and is used for characterizing the etching amount and the etching uniformity and therefore is a very important data parameter during production which may be simply understood as the difference between the etching design value and the etching actual value, i.e., the etching bias.

SUMMARY

An organic light emitting display panel and manufacturing method thereof and a display device seek to reduce the critical dimension bias of the pixel defining layer and improve the display uniformity of the display panel.

To this end, embodiments of the present invention utilize the following technical solutions:

In certain exemplary embodiments, an organic light emitting display panel, comprises a pixel defining layer, which is provided with a plurality of light emitting material filling areas, and a metal layer provided on the pixel defining layer; the metal layer is provided with openings corresponding to the light emitting material filling areas respectively.

In certain exemplary embodiments, the width of the opening is larger than an opening width of the light emitting material filling area.

In certain exemplary embodiments, the distance from the edge of the opening to the edge of the light emitting material filling area on the same side ranges from 1 to 3 μm.

The organic light emitting display panel further comprises light emitting material filled in the light emitting material filling areas, and a second electrode and a first electrode provided above and below the light emitting material and electrically contacted with the light emitting material respectively.

In certain exemplary embodiments, the second electrode is stacked on the metal layer and is arranged in parallel with the metal layer.

In certain exemplary embodiments, the second electrode is a cathode.

In certain exemplary embodiments, the metal layer is made of one or more of the following materials: silver, aluminum, copper, nickel, chromium and platinum.

In certain exemplary embodiments, the pixel defining layer is made of one or more of the following material: polyimide, silicon oxide and silicon nitride.

In certain exemplary embodiments, the surface of the metal layer is hydrophobic.

Embodiments of the present invention further provide a display device, comprising the organic light emitting display panel as described above.

In certain exemplary embodiments a manufacturing method of an organic light emitting display panel, comprises forming a first electrode; forming a pixel defining material layer and curing the pixel defining material layer; forming a patterned metal layer, the metal layer is formed with openings corresponding to preset light emitting material filling areas respectively; forming the light emitting material filling areas in the pixel defining material layer below the openings by a patterning process; filling light emitting material and forming a second electrode.

In certain exemplary embodiments, the width of the opening is larger than the opening width of the light emitting material filling area.

In certain exemplary embodiments, forming a patterned metal layer comprises directly forming the patterned metal layer by means of an evaporation way with the shielding of a mask; or forming a metal material layer followed by forming the patterned metal layer by a patterning process.

In certain exemplary embodiments, the forming light emitting material filling areas in the pixel defining material layer below the openings by a patterning process comprises coating photoresist and performing exposure and development; performing dry etching to remove the pixel defining material exposed to form the light emitting material filling areas; peeling the remaining photoresist.

In certain exemplary embodiments, the pixel defining layer is made of polyimide; an etching gas used in the dry etching mainly comprises oxygen, and further comprises CF4 or SF6, or a mixture of CF4 and SF6 used for adjusting the etching slope angle.

In certain exemplary embodiments, when a photosensitive material is used for the pixel defining material layer, the forming light emitting material filling areas in the pixel defining material layer below the openings by a patterning process, comprises: coating photoresist and performing exposure; peeling the photoresist and removing the exposed pixel defining material by an ashing process to form the light emitting material filling areas.

In certain exemplary embodiments, before the process of forming a first electrode, the method further comprises: a process of forming an active layer, a gate insulator layer, a gate metal layer and a source/drain metal layer of a thin film transistor on a substrate; a process of forming an interlayer insulation layer and vias on the substrate on which the thin film transistor is formed.

The embodiments of present invention provides a display panel and manufacturing method thereof, a display device, wherein a patterned metal layer is provided on a pixel defining layer, the metal layer is provided with openings corresponding to light emitting material filling areas in the pixel defining layer respectively; while the pixel defining layer is patterned, the above-mentioned metal layer and photoresist can be used together as the mask for the pixel defining layer, thereby reducing the critical dimension bias of the pixel defining layer (referring to data from the comparison tests in the embodiments) and improving display uniformity.

BRIEF DESCRIPTION OF THE DRAWINGS

FIGS. 5(a) to 5(g) are schematic views of manufacturing processes of an organic light emitting display panel according to an embodiment of the present invention.

DESCRIPTION OF REFERENCE SIGNS

10—substrate, 101—transition layer, 102—active layer, 103—gate insulator layer, 104—gate metal layer, 105—insulation layer, 106—source/drain electrode layer, 107—planarization layer, 108—interlayer insulation layer, 11—anode, 12—pixel defining layer, 121—light emitting material filling areas, 13—metal layer, 14—light emitting material, 15—cathode, 120—pixel defining material layer, 130—metal film, 200—photoresist, 300—photoresist.

DETAILED DESCRIPTION OF EMBODIMENTS

Embodiments of the present invention provide an organic light emitting display panel and a manufacturing method thereof and a display device which can reduce the critical dimension bias of the pixel defining layer and improve the display uniformity.

The following detailed description for the embodiments of the present invention will be provided in combination with the drawings. Embodiments described herein are merely for explaining the present invention and are not intended to limit the present invention.

Figure 1:
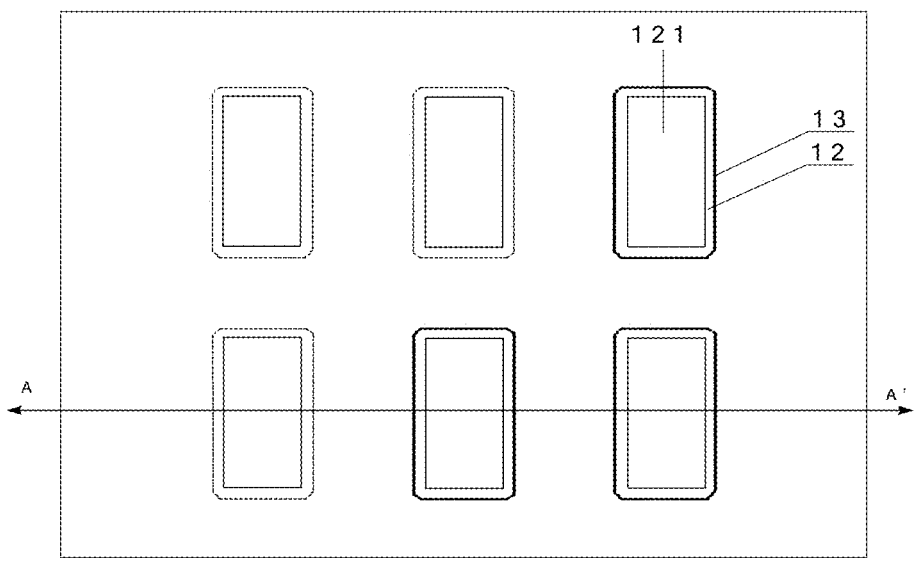
FIG. 1 is a top view of a pixel defining layer and a metal layer on an organic light emitting display panel according to an embodiment of the present invention.
Figure 2:
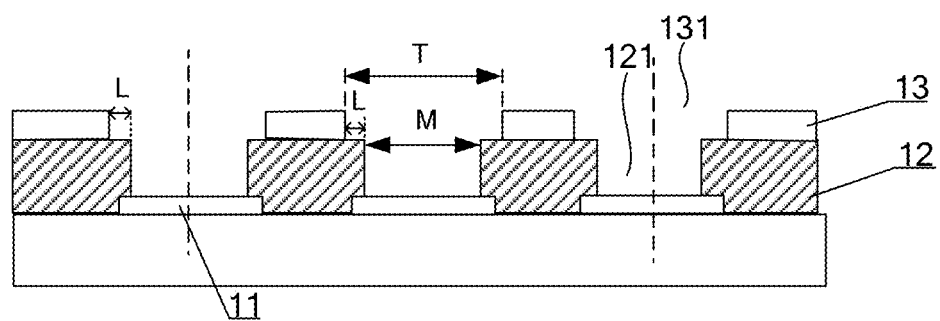
FIG. 2 is a schematic cross-section view taken along the line A-A' in FIG. 1.

Embodiments of the present invention provide an organic light emitting display panel. As shown in FIG. 1 and FIG. 2, the panel comprises: a pixel defining layer 12 which is provided with a plurality of light emitting material filling areas 121. The panel further comprises: a metal layer 13 provided on the pixel defining layer 12; and the metal layer 13 is provided with openings 131 corresponding to the light emitting material filling areas 121 respectively.

An organic light emitting display panel generally comprises a substrate, an anode 11 of ITO (Indium Tin Oxide), light emitting material and an cathode etc. (FIGS. 1 and 2 merely show the layers related to the present invention, such as the pixel defining layer 12 and the metal layer 13), wherein the light emitting material is formed in the light emitting material filling areas 121 within the pixel defining layer 12. In this embodiment, the pixel defining layer 12 is overlaid with the metal layer 13 on which openings 131 (i.e., the patterned metal layer 13) are provided to correspond to the light emitting material filling areas 121 respectively, and herein the centers of openings 131 of the upper metal layer 13 are preferably aligned with those of openings of the lower light emitting material filling areas 121. The purpose of the openings 131 provided on above-mentioned metal layer 13 is: when the pixel defining layer 12 is etched to form the light emitting material filling areas 121, the metal layer 13 can be used as the mask for the pixel defining layer 12 to reduce the critical dimension bias of the pixel defining layer 12. In this design, the space reserved for the critical dimension bias may be designed as smaller so that the light emitting material filling areas 121 may occupy relatively larger space on the panel thereby improving the display uniformity.

In this embodiment, the metal layer 13 has openings 131, that is, the metal layer 13 has hollow structures at the locations corresponding to the light emitting material filling areas 121.

It should be noted that, the more conformal the patterns of the metal layer 13 and the pixel defining layer 12 are, the smaller the critical dimension bias of the pixel defining layer 12 will be reduced; however, the bottom of the light emitting material filling areas 12 are provided with an electrode (for example, the anode 11 in the figure), it is required that the openings 131 of the metal layer 13 are preferably designed to be relatively large, that is, the distribution range to which the openings 131 correspond should be larger than the distribution range to which the light emitting material filling areas 121 correspond, in order to prevent the metal layer 13 from extending into the light emitting material filling areas 121 to be in contact with the electrode at the bottom to cause a short circuit. In practice, if the light emitting material filling areas 121 have a structure being narrow in the opening and wide at the bottom, the distribution range to which the light emitting material filling areas 121 correspond is subject to the size of their openings, i.e., it should be generally guaranteed that the distribution range to which the openings 131 correspond is larger than the opening range of the light emitting material filling areas 121. Those skilled in the field could adjust the size of the openings 131 of the metal layer 13 according to a practical situation, as long as it makes sure that the metal layer 13 is not short to the electrode at the bottom of the light emitting material filling areas 121.

In practice, the distribution range to which the openings 131 correspond may be measured with a opening width in a certain direction, that is, the opening width of the openings 131 is larger than the opening width of the light emitting material filling areas 121. As shown in FIG. 2, in the direction of A-A' in FIG. 1, the opening width of the metal layer 13 is M, and the opening width of the light emitting material filling areas 121 is T. With the current process level, the distance L (L=T−M) from the edge of openings of the metal layer 13 to the edge of the light emitting material filling areas 121 on the same side may be generally set to 1-3 µm, wherein L is optimally set to 2 µm which not only makes sure of no short circuit occurring but also minimizes the critical dimension bias of the pixel defining layer 12.

Moreover, the above-mentioned organic light emitting display panel further comprises: light emitting material filled in the light emitting material filling areas 121, a second electrode and a first electrode respectively provided above and below the light emitting material and electrically contact with the light emitting material respectively; and the metal layer 13 may be connected in parallel to the first electrode or the second electrode.

In this embodiment, the metal layer 13 may be connected in parallel to the first electrode or the second electrode so as to reduce the resistance of the electrode. Because of the complexity of LTPS (Low Temperature Poly-silicon) process, the way of adding assistant wires in other layers to be connected in parallel with the electrodes would cause increased risk of short circuit. By contrast, in this embodiment, the metal layer 13 on the pixel defining layer 12 is used as the parallel resistor and the pixel defining layer 12 can function as an insulator so that the risk of short circuit can be reduced.

In the embodiment, the metal layer 13 may be directly stacked above or below the first electrode (or the second electrode). Alternatively, other intermediate films may be provided between the metal layer 13 and the first electrode so that the metal layer 13 realizes the parallel connection by vias running throughout these intermediate films. In this embodiment, one of the first and second electrodes is an anode and the other is a cathode, and the metal layer 13 may be connected in parallel with the cathode or the anode and act as a parallel resistor to reduce the resistance of the electrode. However, preferably, the metal layer 13 is selectively connected in parallel with the second electrode above the light emitting material for the reason that the second electrode is located above the light emitting material and generally provided in the form of a whole covering layer so that the parallel connection is achieved by directly stacking the metal layer 13 on the metal layer 13 without additional processes to achieve the parallel connection.

The above-mentioned metal layer 13 may be made from one or more of the following materials: silver, aluminum, copper, nickel, chromium and platinum. The specific implementation is not limited to the above metals as long as the resistivity is small enough to meet the design requirements, and there is no limit on how the above mentioned metal materials are used to form the metal layer 13 in this embodiment; one of the above-mentioned metal materials may be independently used to form the metal layer 13; two or more materials of the above mentioned metal materials may be also used in an alloy form to form the metal layer 13; the metal layer 13 may be also formed by stacking a plurality of films with each other, wherein each film is formed of one or more materials of the above-mentioned metals.

The above-mentioned pixel defining layer 12 may be formed by one or more of the following materials: polyimide, silicon oxide and silicon nitride. Also, there is no limit on how the above-mentioned materials are used to form the pixel defining layer 12 in this embodiment, that is, one of the above materials may be independently used to form the pixel defining layer 12; the pixel defining layer 12 may be also formed by stacking a plurality of films with each other, wherein each film may be formed by one or more of the above materials.

In addition, in the embodiment, the metal layer 13 is provided on the top of the pixel defining layer 12. Preferably, the surface of the metal layer 13 is hydrophobic, or is formed by a hydrophobic material, or is obtained with a hydrophobic process on the surface. By contrast, the existing light emitting material is generally hydrophilic such that when the pixel defining layer 12 is formed with the printing method, the light emitting material may form droplets which eventually flow into the light emitting material filling areas 121, even if the printing deviates from the pixel regions, thereby reducing the cost and facilitating mass productions.

Figure 3:
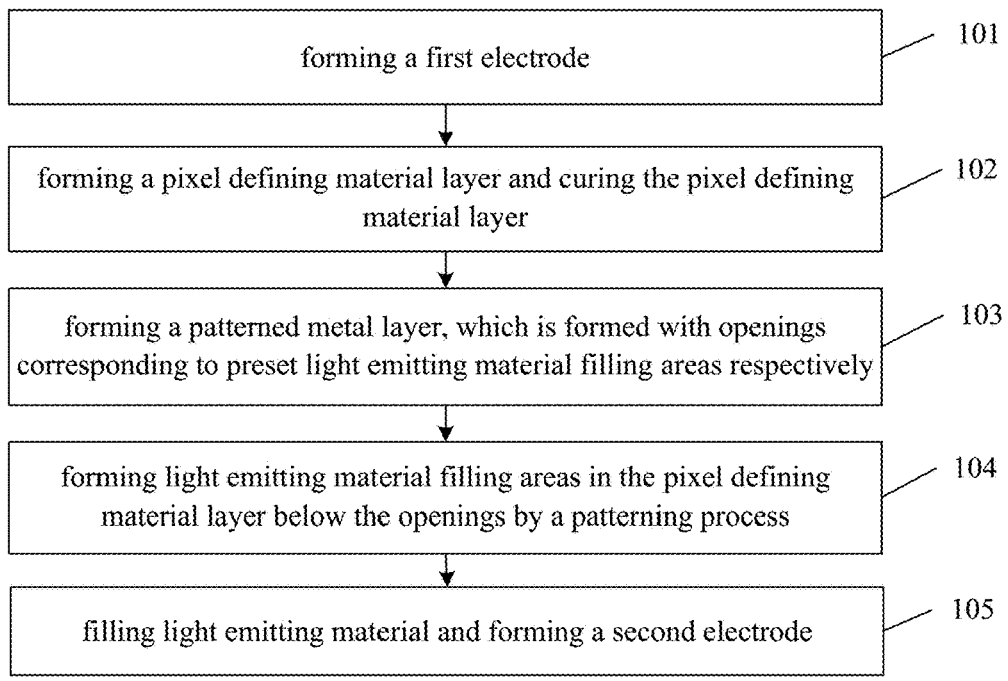
FIG. 3 is a flow chart of a manufacturing method of an organic light emitting display panel according to an embodiment of the present invention.

Embodiments of the present invention also provide a manufacturing method of an organic light emitting display panel, as shown in FIG. 3, the method comprises:

101. forming a first electrode;

Generally, the main component of an organic light emitting display panel is the light emitting device, the main structure of which is formed from two electrodes with electroluminescent material (which is referred as the light emitting material in the embodiment) disposed therebetween, in particular, is formed as a sandwich structure from a thin and transparent tin indium oxide (ITO) having semiconductor properties, another metal anode and electroluminescent material deposed between the both (i.e., tin indium oxide and metal anode). In this step of forming the first electrode of the light emitting device, the approach of firstly forming a film and then patterning the film by the photolithography technology is generally used; however, there is no limit on the specific implementation of this step which may be any ways well known by those skilled in the art.

102. forming a pixel defining material layer and curing the pixel defining material layer;

This step is a filming process of the pixel defining layer 12 which may utilize any filming ways such as coating, evaporating, sputtering, chemical vapor deposition and so on.

103. form a patterned metal layer 13, wherein the metal layer 13 is formed with openings 131 corresponding to the preset light emitting material filling areas respectively.

This step is to pattern the metal layer 13 such that the metal layer 13 is formed with openings 131 corresponding to the preset light emitting material filling areas respectively. In practice, the step may comprises the evaporating method with the shielding of a mask to directly form a patterned metal layer; alternatively, comprises firstly forming a metal material layer and then forming a patterned metal layer by a patterning process. The latter generally uses the photolithography process in which a photoresist is firstly coated, exposed and developed in preset opening areas to form windows with photoresist fully peeled, and the metal layer 13 exposed at the windows is etched with an appropriate etchant to form openings 131.

104. forming light emitting material filling areas 121 in the pixel defining material layer below the openings 131 by a patterning process;

The step is to pattern the pixel defining material layer to form the light emitting material filling areas 121, which may be also accomplished by using the photolithography process, but differ in that the step is generally to use the dry etching which includes but not limited to sputtering and ion beam milling, reactive ion etching (RIE), high density plasma etching (HDP), plasma etching and high pressure plasma etching.

This step generally comprises: a photoresist is coated, exposed and developed, wherein the exposed areas correspond to openings 131 on the metal layer 13 respectively; the pixel defining material exposed is removed by using the dry etching to form the light emitting material filling areas 121, wherein the etching gas used in the dry etching further comprises components used for adjusting the etching slope angle to reduce segment difference and thus prevent the upper layer (for example at which the second electrode is located) from cracking due to excessive segment difference; the remaining photoresist is peeled.

If a photosensitive material is used for the pixel defining material layer, this step may also use the following processes instead of the dry etching, comprising: coating a photoresist and performing the exposure; peeling the photoresist and removing the exposed pixel defining material by an ashing process to form the light emitting material filling areas 121.

In addition, it should be noted that, preferably, the opening width of the light emitting material filling areas 121 formed in this step is smaller than the opening width of the openings 131 of the metal layer in order to prevent the metal layer 13 from being short to the first electrode, as shown in FIG. 2, that is, the exposed areas should not exceed the predetermined range of the light emitting material filling areas 121. Moreover, in the exposure process of the patterning process in this step, the patterned metal layer formed in step 103 can function as the mask which is helpful to eventually reduce the critical dimension bias of the pixel defining layer 12.

105. filling the light emitting material and forming a second electrode.

In this step, filling the light emitting material into the light emitting material filling areas 121 may include but not limited to the evaporating or printing process. This step further comprises forming the second electrode which is similar to the step in prior art and not repeated herein.

In addition, the manufacturing method of the organic light emitting display panel described in this embodiment, before the process of forming a first electrode, further comprises: a process of forming an active layer, a gate insulator layer, a gate metal layer and a source/drain metal layer of a thin film transistor on a substrate; a process of forming an interlayer insulation layer and vias on the substrate on which the thin film transistor is formed. The method further comprises a packaging process etc. following the step 105.

In this embodiment of the metal layer 13 provided on the pixel defining layer 12, a pixel defining material is firstly deposited and then patterned to form the metal layer 13 (i.e., the metal layer having openings 131) and light emitting material filling areas 121 are formed by dry etching at the openings 131 in the metal layer such that the critical dimension bias can be reduced; in addition, the second electrode is stacked with the metal layer 13 which may also act as the resistor connected in parallel with the electrode to reduce the resistance of the electrode.

In order to make sure that those skilled in the field better understand the structure of the organic light emitting display panel and the manufacturing method thereof, the following specific embodiments will be described in detail.

Figure 4:
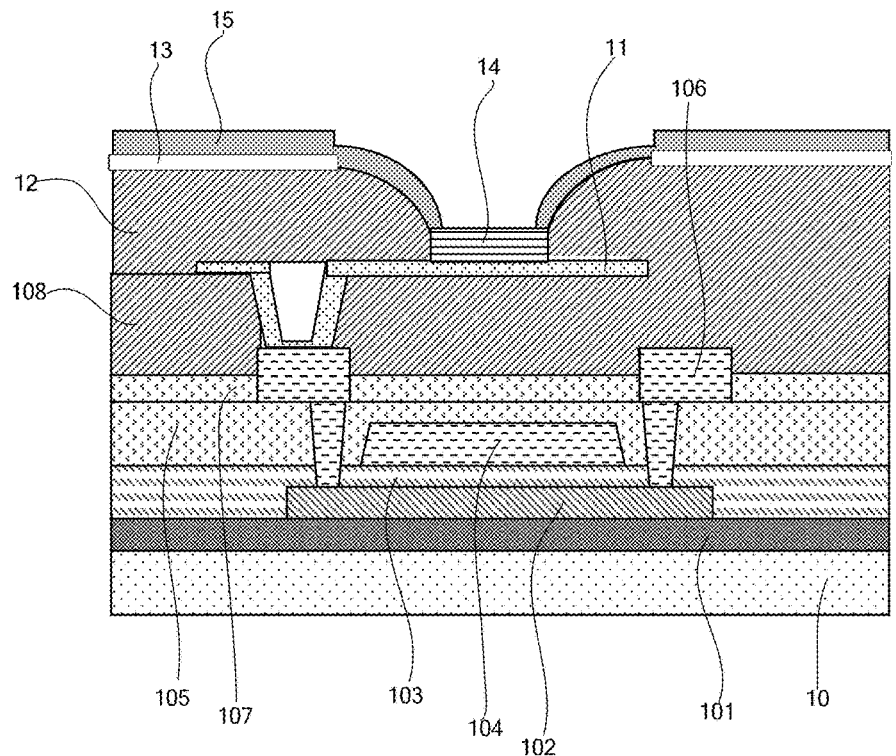
FIG. 4 is a schematic cross-section view of an organic light emitting display panel according to an embodiment of the present invention.

As shown in FIG. 4, an organic light emitting display panel provided by one embodiment of the present invention comprises: a substrate 10, a transition layer 101 and a patterned active layer 102 (used to form channels of TFT) provided in sequence on the substrate 10, a gate insulator layer 103 and a patterned gate metal layer 104 provided on the active layer 102 (including the gate of TFT, gate lines and other connecting wires required to be formed in this layer in the driving circuit); an insulation layer 105 deposited on the gate metal layer 104, a patterned source/drain electrode layer 106 formed on the insulation layer 105, wherein the source/drain electrode layer 106 includes a source, a drain of TFT, data signal lines and other connecting wires required to be formed in this layer in the driving circuit, and the source and drain of TFT are respectively connected to the active layer 102 by vias in the insulation layer 15; a planarization layer 108 and an interlayer insulation layer 107 provided on the source/drain electrode layer 106 to reduce segment difference and achieve interlayer insulation; an anode 11 provided on the interlayer insulation layer 107, wherein the anode 11 is connected with the drain of the driving TFT through vias; a pixel defining layer 12 provided on the anode 11, wherein the pixel defining layer 12 is provided with light emitting material filling areas 121 at the locations corresponding to the anode 11 and the light emitting material filling areas 121 are filled with light emitting material 14; a metal layer 13, a cathode 15 and other package film layers (which are not shown in figures) provided in sequence on the pixel defining layer 12.

In this embodiment, the metal layer 13 is of silver or aluminum; the pixel defining layer 12 is formed by Polyimide (PI); the active layer 102 is of amorphous silicon material; a cathode material layer (i.e., the cathode 15 of the light emitting device) is stacked on the metal layer 13 and connected in parallel to the metal layer 13.

Hereafter, the general processes of manufacturing the above-mentioned organic light emitting display panel will be briefly described in combination with this specific embodiment:

In Step 1, forming a transition layer 101, an amorphous silicon layer P—Si (corresponding to the active layer 102 in the drawings), a gate insulator (GI) layer 103, a gate metal layer 104, an insulation layer 105, a source/drain electrode layer 106, a planarization layer 108, an interlayer insulation layer 107, an anode electrode layer (corresponding to the anode 11 in the drawings) in sequence on a glass substrate, and coating and curing a layer of pixel defining material (corresponding to the pixel defining material layer 120 in the drawings), as shown in FIG. 5(*a*); a layer of Ag or Al metal is then formed by the sputtering process (corresponding to the metal film 130 in the drawings), as shown in FIG. 5(*b*). The organic light emitting display panel is manufactured along the direction indicated by the arrow in the drawing, and the arrangement sequence in FIGS. 5(*a*) to 5(*g*) is determined accordingly.

In Step 2, forming the patterns of openings 131 corresponding to the light emitting material filling areas 121 on the metal film 130 (i.e., Ag or Al metal) by the patterning process. In this step, a metal is firstly deposited and then a photoresist 200 is coated on the metal layer, and exposure, development and etching etc. are performed, as shown in FIG. 5(*c*). In the etching step, Ag or Al metal is etched with the wet etching process. The optional etchants may include components such as phosphoric acid, acetic acid, nitric acid, other additives and water etc., and there is no limit on the etching time which may be set according to requirements from different equipments.

In Step 3, a photoresist coating process is performed again on the photoresist 200 to form a photoresist 300, as shown in FIG. 5(*d*); performing the exposure and development steps to form windows with the photoresist fully removed, as shown in FIG. 5 (e); then performing the dry etching to the pixel defining material layer 120 at the windows, and FIG. 5(f) shows the result after the dry etching. The etching gas mainly includes oxygen which may be added with an appropriate amount of $CF_4$ or $SF_6$ for adjusting the slope angle, and there is no limit on the pressure, power and time of etching which may be adjusted according to requirements from various equipments. The slope angle of the pixel defining layer 12 is adjusted by adding $CF_4$ or $SF_6$ gas to increase the impact such that the slope angle can be changed and the segment difference is adjusted.

In Step 4, then, as shown in FIG. 5(g), peeling the photoresist 200, 300 and proceeding to the subsequent processes to finish the panel.

In order to further demonstrate that the metal layer 13 functions to reduce the critical dimension bias of the pixel defining layer 12, results from comparison tests are listed as follows:

The test 1 uses PI to form the critical dimension pattern (the prior art) and Table 1 shows that the pattern formed in the test 1 is measured at 7 different locations and compared to the design values to obtain the Bias data wherein the minimum value is 1.51 μm, the maximum value is 2.73 μm and the average value is 2.00 μm.

The test 2 is to make the critical dimension pattern by the method of forming the pixel defining layer and metal layer mentioned in the embodiment of the present invention (see related parts of Step 1 to 3), wherein PI film forming and various process parameters in photolithography are exactly identical to those in test 1 and PI pattern is also the same. Table 2 shows that the pattern formed in test 2 is measured at 7 different locations to calculate Bias data wherein the minimum value is 1.35 μm, the maximum value is 2.63 μm and the average value is 1.94 μm.

It can be seen from the comparison that, the critical dimension bias of the pixel defining layer can be reduced from 2.0 μm to around 1.94 μm by means of the structure of the organic light emitting display panel and manufacturing method thereof provided by this embodiment, and therefore the aperture ratio and display uniformity can be improved accordingly.

TABLE 1

| Test 1 | Material | Thickness | Critical dimension bias (μm) |
|---|---|---|---|
| 1st unit test | PI | 1.5 μm | 2.73 |
| 2nd unit test | PI | 1.5 μm | 1.86 |
| 3rd unit test | PI | 1.5 μm | 2.31 |
| 4th unit test | PI | 1.5 μm | 1.70 |
| 5th unit test | PI | 1.5 μm | 2.18 |
| 6th unit test | PI | 1.5 μm | 1.72 |
| 7th unit test | PI | 1.5 μm | 1.51 |
| Average | | | 2.00 |

TABLE 2

| Test 2 | Material | Thickness | Critical dimension bias (μm) |
|---|---|---|---|
| 1st unit test | Ag | 1000 Å | 2.50 |
| 2nd unit test | Ag | 1000 Å | 2.63 |
| 3rd unit test | Ag | 1000 Å | 1.35 |
| 4th unit test | Ag | 1000 Å | 1.77 |
| 5th unit test | Ag | 1000 Å | 2.18 |
| 6th unit test | Ag | 1000 Å | 1.35 |
| 7th unit test | Ag | 1000 Å | 1.82 |
| Average | | | 1.94 |

Embodiments of the present invention also provide a display device that comprises any one of the above-mentioned organic light emitting display panels, which is capable of reducing the critical dimension bias of the pixel defining layer and thereby improving the aperture ratio and display uniformity; meanwhile the parallel connection of the metal layer with the electrode further decreases the resistance of the electrode and reduces the power consumption of the display device. Moreover, the manufacturing processes are simple without need of additional processes used to form wires connected in parallel with the electrode for decreasing the resistance of the electrode such that the cost can be reduced which is in favor of mass production. Said display device may be: any product or part having the displaying function, such as OLED panel, electronic paper, mobile phone, tablet computer, television, display, notebook computer, digital photo frame, and navigator and so on.

Technical features described in embodiments of the present invention may be arbitrarily combined with each other in no conflict scenario.

It should be noted that, while embodiments of the present invention have been illustrated with the manufacturing processes of the light emitting layer of the organic light emitting display panel as an example, the present invention is not limited to this embodiment; rather, the present invention can be widely applied to the application in which the critical dimension bias of one layer is required to be decreased and a metal layer can be designed on the layer.

The above description is only the specific embodiments of the present invention, but the scope of the present invention is not limited to this. In the technical scope disclosed by the invention, any skilled in the art can easily appreciate modifications or replacements which should fall within the scope of the invention. Accordingly, the scope of the present invention should be defined by the scope of the claims.

The invention claimed is:

1. A method of manufacturing an organic light emitting display panel comprising:
   forming a first electrode;
   forming a pixel defining material layer and curing the pixel defining material layer;
   forming a patterned metal layer with openings corresponding to preset light emitting material filling areas respectively;
   forming light emitting material filling areas in the pixel defining material layer below the openings by a patterning process;
   filling light emitting material; and
   forming a second electrode,
   wherein the width of the opening is larger than an opening width of the light emitting material filling area.

2. The method of claim 1, wherein the step of forming a patterned metal layer comprises:
   directly forming the patterned metal layer using an evaporation method with the shielding of a mask; or
   forming a metal material layer followed by forming the patterned metal layer by a patterning process.

3. The method of claim 1, wherein the step of forming a patterned metal layer comprises:
   directly forming the patterned metal layer by means of an evaporation method with the shielding of a mask; or
   forming a metal material layer followed by forming the patterned metal layer by a patterning process.

4. The method of claim 1, wherein the forming light emitting material filling areas in the pixel defining material layer below the openings by a patterning process comprises:

coating a photoresist and performing exposure and development;

performing dry etching to remove the pixel defining material exposed and form the light emitting material filling areas;

peeling the remaining photoresist.

5. The method of claim 1, wherein the step of forming light emitting material filling areas in the pixel defining material layer below the openings by a patterning process comprises:

coating a photoresist and performing exposure and development;

performing dry etching to remove the pixel defining material exposed and form the light emitting material filling areas;

peeling the remaining photoresist.

6. The method of claim 4, wherein the pixel defining layer comprises polyimide;

the etching gas used in the dry etching comprises oxygen, and further comprises CF4 or SF6, or a mixture of CF4 and SF6 used for adjusting an etching slope angle.

7. The method of claim 1, wherein when a photosensitive material is used for the pixel defining material layer, the step of forming light emitting material filling areas in the pixel defining material layer below the openings by a patterning process comprises:

coating a photoresist and performing exposure;

peeling the remaining photoresist and removing the exposed pixel defining material by an ashing process to form the light emitting material filling areas.

8. The method of claim 1, wherein when a photosensitive material is used for the pixel defining material layer, the step of forming light emitting material filling areas in the pixel defining material layer below the openings by a patterning process comprises:

coating a photoresist and performing exposure;

peeling the remaining photoresist and removing the exposed pixel defining material by an ashing process to form the light emitting material filling areas.

9. The method of claim 1, wherein before the process of forming a first electrode, the method further comprises:

a process of forming an active layer, a gate insulator layer, a gate metal layer and a source/drain metal layer of a thin film transistor on a substrate;

a process of forming an interlayer insulation layer and vias on the substrate on which the thin film transistor is formed.

\* \* \* \* \*